United States Patent [19]

Bok et al.

[11] 4,370,356
[45] Jan. 25, 1983

[54] METHOD OF MENISCUS COATING

[75] Inventors: Hendrik F. Bok, Fairhaven, Mass.; Philip J. Birbara, Windsor Locks, Conn.

[73] Assignee: Integrated Technologies, Inc., Acushnet, Mass.

[21] Appl. No.: 265,724

[22] Filed: May 20, 1981

[51] Int. Cl.³ .......................... B05D 3/06; B05D 1/28
[52] U.S. Cl. ...................................... 427/38; 118/50.1; 118/244; 118/401; 118/419; 118/429; 118/DIG. 2; 427/294; 427/299; 427/314; 427/428; 427/429; 427/345
[58] Field of Search ............................... 427/294–298, 427/428, 9, 38, 299, 314, 345; 118/242, 244, 401, 419, 420, 429, DIG. 2, 50, 50.1

[56] References Cited

U.S. PATENT DOCUMENTS

| | | | |
|---|---|---|---|
| 1,289,507 | 12/1918 | Mason | 118/244 X |
| 3,294,576 | 12/1966 | Geraghty | 118/204 X |
| 3,367,791 | 2/1968 | Lein | 118/DIG. 2 |
| 3,429,741 | 2/1969 | Moriarty | 118/DIG. 2 |
| 3,473,955 | 10/1969 | Moriarty | 118/DIG. 2 |
| 3,535,157 | 10/1970 | Steinhoff et al. | 118/244 X |
| 3,589,975 | 6/1971 | Andrews et al. | 118/244 X |
| 3,756,196 | 9/1973 | Furuuchi et al. | 118/401 |
| 4,004,045 | 1/1977 | Stelter | 427/55 |
| 4,114,563 | 9/1978 | Schedler et al. | 118/419 X |
| 4,154,193 | 5/1979 | Morigachi et al. | 118/242 X |

FOREIGN PATENT DOCUMENTS 1071906 12/1959 Fed. Rep. of Germany ... 118/DIG. 2

*Primary Examiner*—Michael R. Lusignan
*Attorney, Agent, or Firm*—David H. Semmes; Warren E. Olsen

[57] ABSTRACT

Coating, particularly a method for uniformly depositing a micro thin layer of fluid upon the surface of an object such as a substrate, or the like. Flowing the coating material through a permeable and sloping surface, so as to develop a downward laminar flow of coating material on the outside of the sloping surface. The object to be coated is advanced tangentially to the flow of coating material such that the surface to be coated intersects laminar flow of coating material at the apex of the sloping surface. Meniscii of coating material are supported both at the leading edge and the trailing edge of coating material in contact with the surface to be coated. The uniform disengagement and drainage of deposited excess coating material from the coated surface are ensured by uniform meniscii and the constant downward laminar flow of coating material on the outside of the sloping surface.

15 Claims, 11 Drawing Figures

LEGEND
T = FLUID CONTACT TRAILING EDGE
L = FLUID CONTACT LEADING EDGE
V = VELOCITY OF SUBSTRATE (POROUS FLUID APPLICATOR STATIONARY)

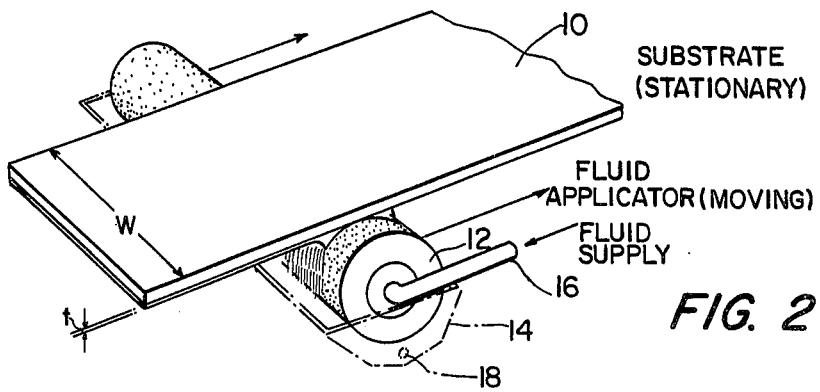

FIG. 2

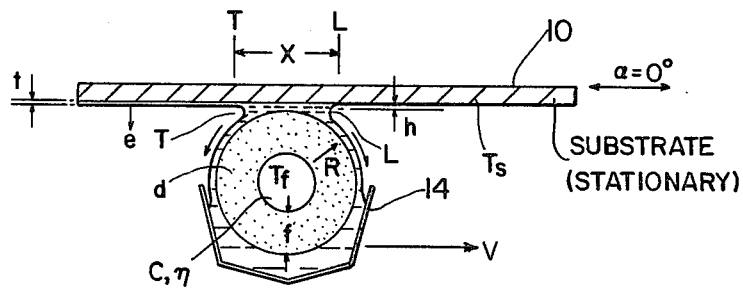

LEGEND

L = LEADING EDGE MENISCUS
T = TRAILING EDGE MENISCUS
X = DISTANCE BETWEEN LEADING AND TRAILING EDGE MENISCII CM
$\alpha$ = SUBSTRATE INCLINATION ANGLE ($\alpha$=0 IN ABOVE ILLUSTRATION)
t = FILM THICKNESS, $\mu$M
h = HEIGHT OF SUBSTRATE ABOVE POROUS TUBE, CM
V = TRAVEL RATE OF TUBE RELATIVE TO SUBSTRATE, CM/SEC.
d = AVERAGE PORE DIAMETER, $\mu$M
f = POROUS TUBE WALL THICKNESS, CM
e = SOLVENT EVAPORATION RATE $CM^3/CM^2$-SEC
R = FLUID FLOW RATE $CM^3/CM^2$-SEC
$T_f$ = TEMPERATURE OF FLUID, °C
$T_s$ = TEMPERATURE OF SUBSTRATE, °C
W = OVERALL WIDTH OF SUBSTRATE, CM
C = SOLIDS CONCENTRATION IN FLUID, %
$\eta$ = VISCOSITY OF FLUID, CP

FIG. 3

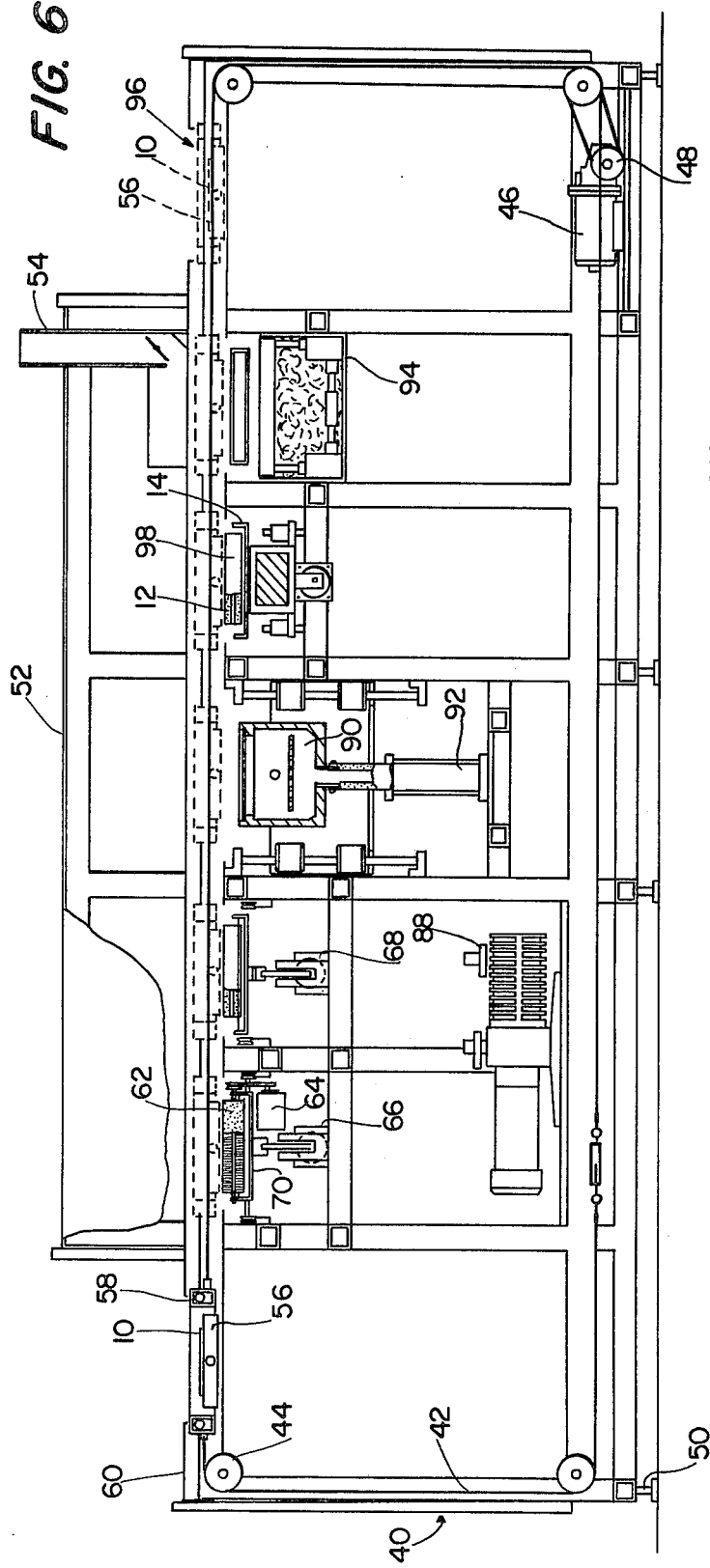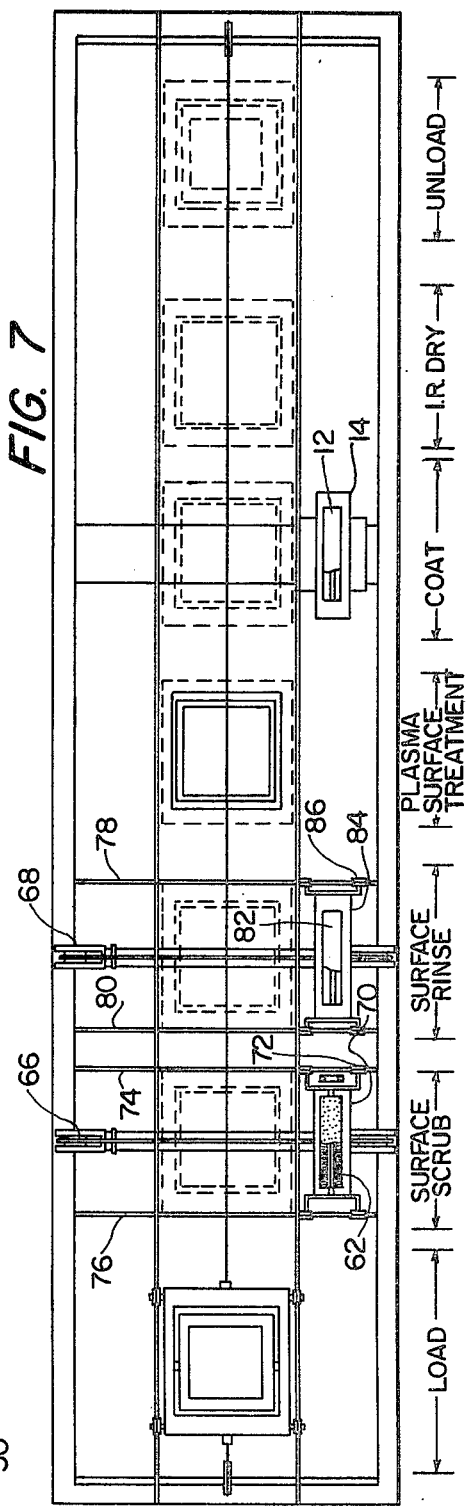

METHOD OF MENISCUS COATING

BACKGROUND OF THE INVENTION (1) Field of the Invention

Coating, particularly a thin and uniform coating of a substrate surface under clean room conditions. The precision coating may be a photo resist, lacquer dopant, metallo-organic, anti-reflective, or the like.

(2) Description of the Prior Art

MASON 1,289,507
GERAGHTY 3,294,576
LEIN 3,367,791
MORARITY 3,429,741
MORARITY 3,473,955
STEINHOFF 3,535,157
ANDREWS 3,589,975
FURUUCHI et al. 3,756,196
STELTER 4,004,045
SCHNEDLER et al. 4,114,563
MORIGUCHI et al. 4,154,193

The prior art has addressed the problem of uniformly depositing micro thin layers on the face of a panel or substrate. For the most part, rotating cylinders partially submerged in the coating fluid are used in an attempt to achieve uniform fluid deposition by means of meniscus techniques.

STELTER flows coating material across a horizontal weir and contacts the substrate surface against the laminar flow. A principal shortcoming of the weir technique is the inability to achieve precise fluid flow control. This circumstance can result in coating material thickness variation, affecting the quality of the coating.

The above-listed patents are discussed in a Prior Art Statement being submitted separately.

SUMMARY OF THE INVENTION

According to the present invention, meniscus coating of an object such as a substrate is accomplished by flowing a coating material through a permeable and sloping surface, so as to develop a downward laminar flow of coating material on the outside of the sloping surface. The object, having a surface to be coated, is advanced tangentially to the downward laminar flow of coating material, such that the surface to be coated intersects the laminar flow of coating material at the apex of the sloping, permeable surface. Meniscii of flowing coating material are supported both at the leading edge and the trailing edge of coating material in contact with the surface to be coated. The uniform disengagement and drainage of deposited excess coating material from the coated surface are ensured by uniform meniscii and the constant downward laminar flow of coating material on the outside of the sloping surface.

DESCRIPTION OF THE DRAWINGS

FIG. 2 is a fragmentary perspective showing a modification wherein the inverted substrate is supported in a stationary mode, while the cylindrical surface is advanced longitudinally with respect to the inverted substrate.

FIG. 3 is a fragmentary vertical sectional view wherein the parameters relating to the deposition of precision films are set forth.

FIG. 6 is a vertical elevation of a proposed substrate surface cleaning, coating and drying assembly.

FIG. 7 is a top plan of the assembly illustrated in FIG. 6.

DESCRIPTION OF THE PREFERRED EMBODIMENTS

This invention relates to an apparatus and method for depositing fluid, such as photo resists, lacquers, dopants, polyimides, anti-reflection coatings, and the like, upon flat or curved planar surfaces of substrates which may include glass, ceramics, metal, plastics and combinations thereof.

Figure 1:
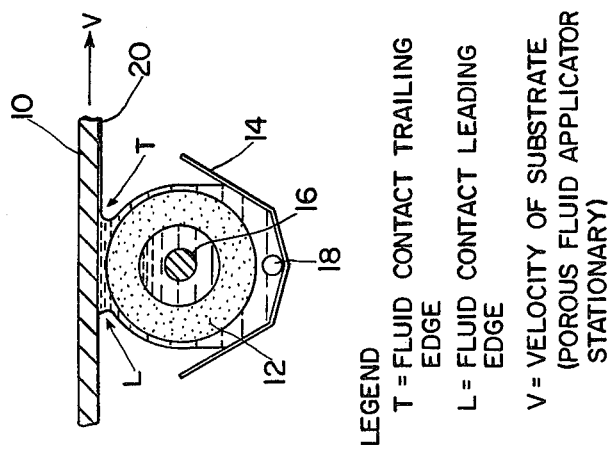
FIG. 1 is a schematic view, partially in section, showing the advancing of an inverted substrate tangentially to the downward flow of coating material on the outside of a stationary cylindrical surface.

In FIG. 1 there is illustrated an inverted substrate 10 being coated according to the present method of meniscus coating by means of a cylindrical applicator 12, having a porous wall. The cylindrical applicator is supported upon a transverse axis and includes a coating fluid supply conduit 16, a coating material recovery through 14 and coating material outlet 18.

The inverted substrate is advanced uniformly and tangentially with respect to the downward flow of coating material over the outside surface of cylinder 18, so as to develop a meniscus at L, the fluid contact leading edge and T, the fluid contact trailing edge.

In FIG. 2, there is illustrated a modified method wherein the substrate 10 is supported in a stationary mode while the cylindrical applicator 12 is advanced longitudinally with respect to the inverted surface of the substrate.

In FIG. 3 there are set forth the parameters for meniscus coating, according to the mode illustrated in FIGS. 2 and 3. with respect to the downward laminar flow of coating material on the outer surface of porous cylindrical applicator 12, so as to apply a thin coating 20 to the planar surface.

Flow of coating material radially through the porous wall is via conduit 16 and a series of pilot operated selection valves 28. The coating material tank may be temperature controlled as at 30 and may include solids concentration controller 34, viscosity indicator 32 and a mixing paddle, as illustrated. A nitrogen purge supply may be employed also, together with a 0.1–0.5 micron membrane filters 24 and 25. One or more circulation pumps 26 and 27 may be employed, both to advance the fluid material into conduit 16. Transport of recovered coating material to the coating material tank or dump tank and transport of cleaning solvent to the cleaning solvent or dump tank is via exit conduit 18. A plurality of flow control valves 36, 38 may also be employed.

In FIGS. 6 and 7 there is illustrated a cleaning, coating and drying assembly, which may be used according to the present method. Substrate 10 is mounted upon vacuum fixture 56 which rotates 180° in a transport frame 58, supported upon adjustable cables 42, encircling pulleys 44, 48, and the like, and driven by indexing drive motor 46. The entire console 40 may be supported upon adjustable threaded legs 50, so as to present a level table top 60. A surface scrubbing installation is illustrated, as comprised of rotating scrub brush 62, rotated by drive motor 64 and supported within tank 70. The brush 62 and tank 70 assembly may be mounted upon rollers 72, such that the tank and brush assembly may traverse the line of advance of fixture 56 by means of tracks 76 and 74 and cable cylinder drive 66.

An individual cable cylinder drive 68 may be employed, also, both for the surface rinsing installation, which includes cylindrical porous applicator 82 maintained within tank 84, which includes a solvent flush fluid. The surface rinse tank 84 and cylindrical applicator 82 are mounted upon wheels 86 which engage tracks 78 and 80.

In FIG. 6, plasma chamber 90 is illustrated as being vertically reciprocating by means of lift mechanism 92, such that the chamber 90 engages the inverted substrate.

The cylindrical applicator 12 and recovery tank 14 comprise the coating application station which may include a nitrogen bearing arrangement, as illustrated schematically in FIG. 6. An infrared heating panel 94 may be employed to dry the coating material. The entire system may include hood 52 with venting through system exhaust 54. Also, as illustrated in FIG. 6, transport frame 56 may be pivoted 180°, after drying, as to present the substrated coated surface right side up at the unloading station.

Figure 9:
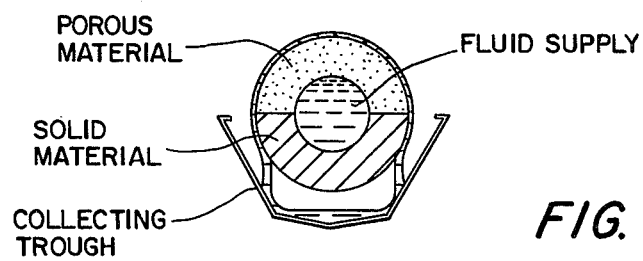
FIG. 9 is a vertical sectional view of a further modification, wherein lower part of the cylindrical wall is impervious to the flow of coating material.
Figure 10:
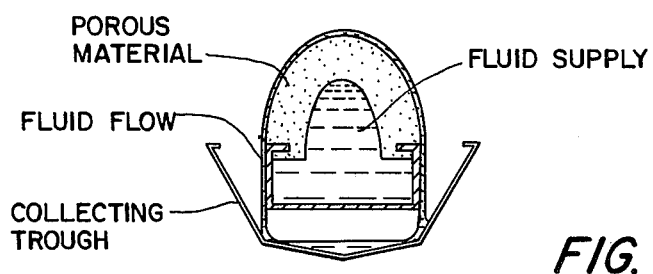
FIG. 10 is a vertical sectional view of a further modification, wherein the downward laminar flow of coating material is over an oblate surface.
Figure 11:
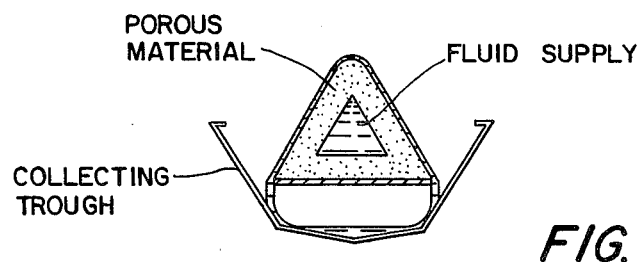
FIG. 11 is a further modification wherein the downward laminar flow of coating material is over a triangular surface.

Modified forms of fluid applicators are illustrated in FIGS. 9, 10 and 11. In the FIG. 9 modification, the lower portion of the cylindrical applicator is filled with a solid material, so as to preclude the radial flow of coating material therethrough.

In FIG. 10 modification, the cylindrical surface is modified such, so as to have an oblate cross section.

In FIG. 11 the cylindrical surface is modified, so as to have a triangular cross section.

Figure 4:
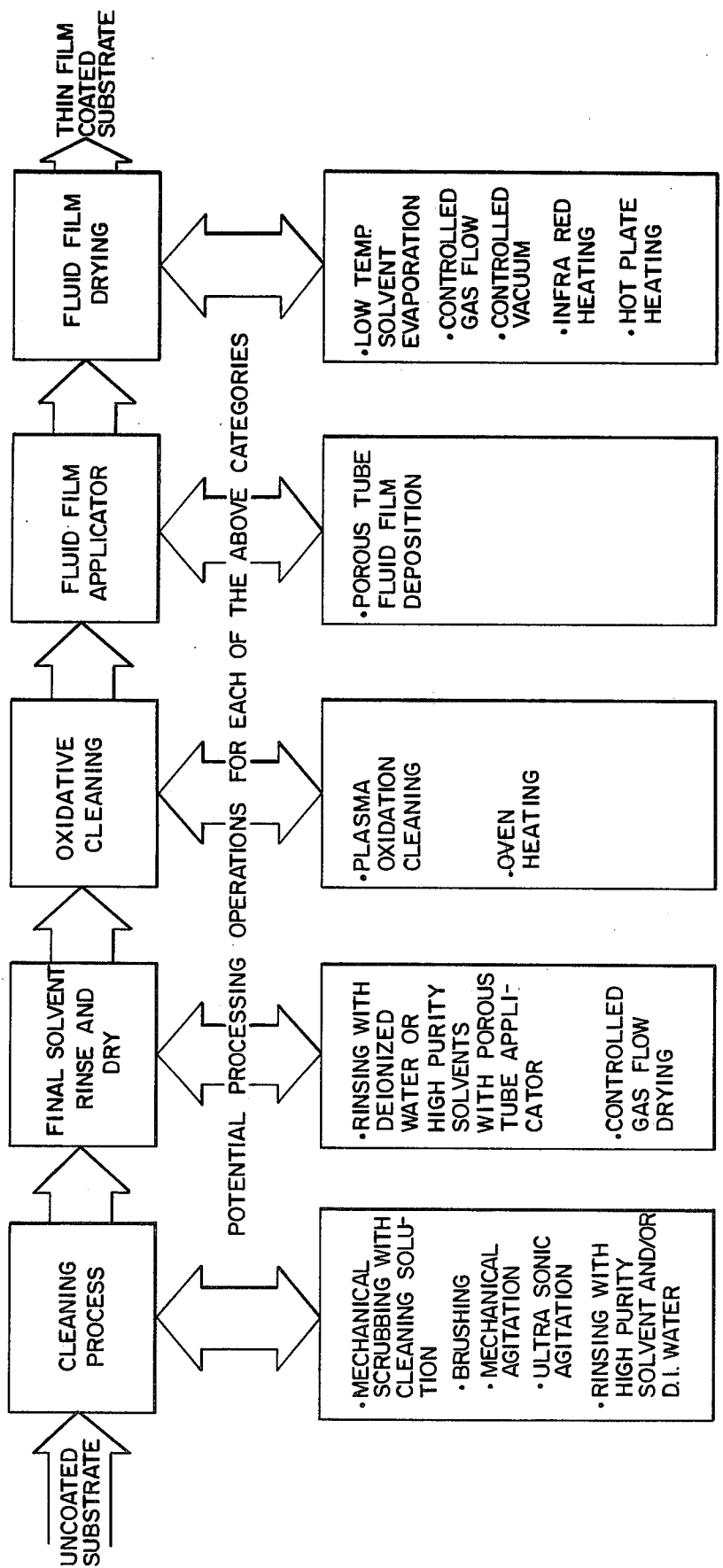
FIG. 4 is a schematic summary of substrate processing steps, which include cleaning, coating and drying that may be utilized with the practices of the present invention.

According to the present method, a precision coating is applied to the substrate surface in a carefully controlled clean room environment. The suggested apparatus and method for depositing uniform thin films are facilitated by a closely coupled surface conditioning process prior to the application of the thin fluid film. As illustrated in FIGS. 4, 6 and 7, the initial substrate processing stages provide substrate cleaning with a solvent to remove surface contaminants, a drying step which typically may involve solvent evaporative techniques such as a controlled gaseous flow process and a plasma treatment for trace organic removal and complete dehydration. Likewise, film thickness integrity and uniformity will be enhanced by close coupling solvent evaporative and film baking steps after application of the thin films. All processing operations may be purged with nitrogen or other inert gases to avoid oxygen and moisture contact during the application.

The shape of the porous cylindrical applicator surface may be convex, eliptical or further modified from the cylindrical shape without departing from this invention. It should be noted that a porous cylindrical applicator may be utilized, also, to clean and rinse the substrate surface with solvent prior to the film coating step.

The thin uniform coatings produced by the method of the present invention result in relatively defect-free coatings due to improved removal of particulate contamination and absorbed surface gases, improved film deposition uniformity for the entire substrate surface and improved film optical qualities with minimum pattern due to a more uniform disengagement of the trailing edge coating fluid meniscus.

Figure 8:
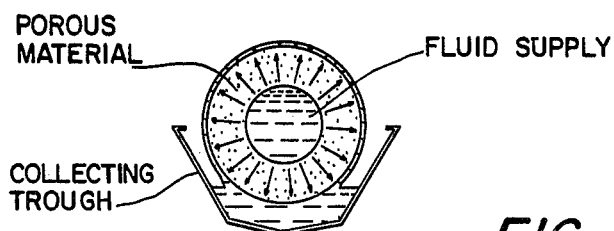
FIG. 8 is a vertical sectional view, showing a cylindrical applicator, having a porous wall, so as to dispense the coating material radially through the cylindrical wall.

Porous cylindrical applicator 12 may be constructed of metal, plastic or ceramic materials. Its structure is such that it contains a uniform, interconnected, open-cell structure. In practice, such that the downward flowing of film over the convex surface of the cylinder is laminar and uniform. The radial flowing of fluid circulating through the coating system may be reduced by masking the flow through the lower portion of the tube as illustrated in FIG. 8. Masking may be effectively carried out by sealing the pores with a resinous or water glass formulation.

Referring to FIG. 3, the rate of fluid flow R to the exterior surface of the cylinder is dependent upon cylindrical surface parameters, which include the wall thickness, f, and the average pore diameter, d. The porous cylinder effectively provides filtered coating material, immediately prior to substrate contact, thus effectively controlling potential fluid contamination.

The inverted substrate is positioned to nearly contact the top surface of the cylinder in a horizontal or slightly inclined orientation from a horizontal plane and, thus, tangentially engage the flowing coating material. FIG. 3 details the fluid contact parameters in the interfacial region between the substrate and fluid. Fluid downward flow and drainage occur on both sides of the cylindrical applicator convex surfaces. The length of fluid contact, x, of the substrate between the leading edge meniscus L and the trailing edge meniscus T for a given cylindrical applicator is determined by several parameters including the height of the substrate above the porous tube, h; the fluid flow rate R; the fluid viscosity, $\eta$; the temperature of the fluid, $T_f$; the temperature of the substrate, $T_s$; and the porous cylindrical applicator rate of advance, V.

Drainage of excess coating material is aided by gravity and the downward laminar flow of the falling wetted film on the convex surface of the porous cylinder. The deposited excess liquid in the film is drained by gravity from both convex surfaces of the cylinder, since the liquid/liquid cohesive forces are less than the liquid/solid adhesive forces. Uniform and straightline breaking of the meniscus interface at both the leading and trailing edges, contacting the substrate, is enhanced by the uniform downward flow of the falling wetted film on the convex surfaces of the cylindrical applicator.

A significant advantage of the present method is the minimal filtration requirement of the coating solution, due to the contamination removal in the prior scrubbing, rinsing and plasma cleaning steps; also, the minimal exposure of coating fluid to the surrounding environment, which ordinarily results in contamination by moisture, gas absorption and/or suspended particulates. Masking of the pores on the underside of the porous cylinder 12 proportionately reduces the quantity of fluid circulated through the system. This circumstance is particularly desirable for certain photo resist solutions that are chemically altered due to shearing effects, while passing through submicron size membrane filters at pressures exceeding two atmospheres.

According to the present invention, very thin films of positive photo resist, ranging downwardly to a thickness of 0.2 microns, have been deposited on various surfaces including glass, ceramic and metal substrate surfaces with an end-to-end film uniformity of plus or minus 1%. As depicted in FIG. 3, thickness and constancy thereof are controlled by the solution viscosity, $\eta$, draw rate, V; fluid flow rate, R; substrate height above the tube, h; substrate surface characteristics, and the evaporation rate, e; as influenced by $T_s$ and $T_f$, the temperatures of the substrate surface and coating material, respectively.

Figure 5:
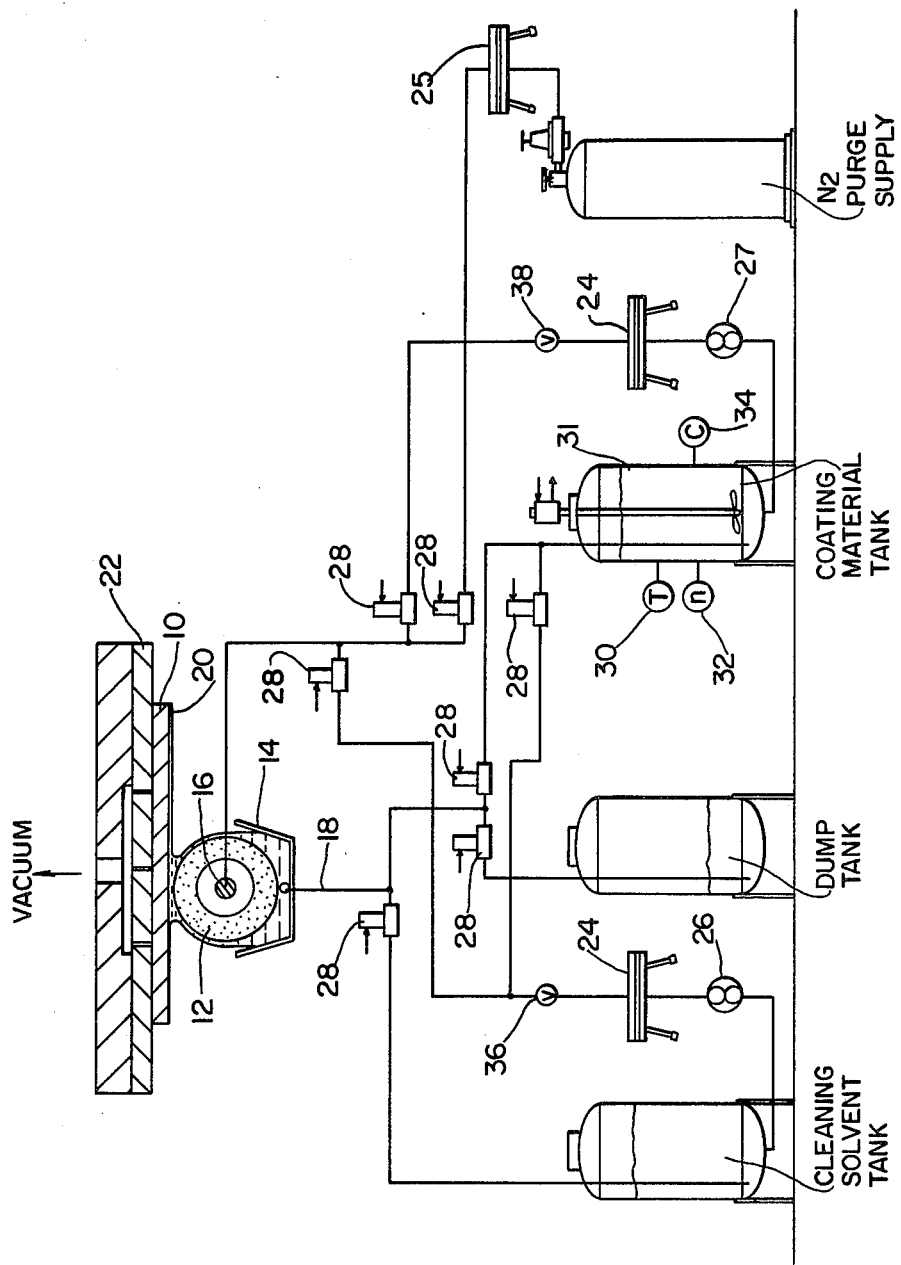
FIG. 5 is a schematic view showing a proposed installation for practice of the present method.

As illustrated in FIG. 5, circulation of the coating solution through the coating material tank, containing approximately a coating material volume on the order of several magnitudes greater than the fluid circulating through the remainder of the system, will aid in minimizing variations in the coating material solids concentration over a period of time, due to solvent removal via evaporation.

Uniformity of coating fluid solids concentration can be readily maintained by proper makeup adjustments of solvent in the coating material tank, as determined by analysis of the coating fluid.

A solvent tank and dump tank will be desirable to provide the coating application system with a cleaning capability as required and after processing shutdown. A typical procedure will be to discharge the coating fluid to the coating material tank and then clean the system with solvent until the desired level of coating material removal is accomplished.

EXAMPLE 1

TYPICAL CAVEX PROCESS FOR EQUIPMENT AS SHOWN IN FIGS. 7 AND 8

Substrate:
3/16" thick glass substrate 10 previously coated with Indium Oxide. Substrate used for Liquid Crystal Display devices.
Transport Mechanism:
Machine as shown in FIGS. 6 and 7 is equipped with an indexing mechanism which transports the substrate holding fixture through the following process stations:
Station #1: Load Station;
Station #2: Surface Scrub Station;
Station #3: Surface Rinse Station;
Station #4: Plasma Surface Treatment Station;
Station #5: Coating Application Station;
Station #6: Drying Station; and
Station #7: Unload Station.

CLEANING PROCEDURE PRIOR TO COATING:

1. Load Station and inverting of substrate;
2. Surface scrub station—to dislodge and remove particulates, organic and inorganic contaminants;
2 1/16" O.D. nylon brush 12, rotating at 120 RPM (adjustable from 50-200 RPM) Isopropyl alcohol is used to wet rotating brush. Alcohol constantly filtered through 0.2 micron depth filter.
3. Surface rinse station—a stationary porous applicator 82 is used to constantly flush-wet the surface of the substrate with Isopropyl alcohol to remove contaminants. Alcohol is constantly filtered through a 0.2 micron depth filter.
4. Plasma surface treatment station—to remove trace moisture, absorbed gaseous and organic contamination, so as to provide maximum surface wetting.
After the substrate is indexed to this station, plasma vacuum chamber 90 is pushed upwardly onto the support pallet.
Vacuum chamber 90 is pumped down to 1 Torr vacuum after which an oxygen plasma is established for 40 seconds. Substrate 10 temperature will reach 50° C.
5. Coating application station—positive photo resist, Shipley 1350J, applied at 15% solid content. Material constantly filtered through 0.2 micron depth filter.
Feed pressure to cylindrical applicator—14 P.S.I.
Pore size cylindrical applicator—10 micron.
Cylindrical applicator scanning speed —4" per minute.
Coating thickness obtained—0.75 micron.
6. Drying station—an infrared radiating panel 94 is used to dry the coating.
Panel temperature set at t 350° F. Cross flow of air—1.0 linear feet per minute. Drying time—4 minutes. Temperature substrate—92° F. after 4 minutes.
7. Unloading station—pivoting of substrate 10 right side up and removal from pallet.

It is the purpose of this invention to apply substrate coatings in a "clean room" atmosphere with the substrate surface cleaning, rinsing, plasma treating and drying process steps being coordinated with the meniscus coating step to provide films with high coating integrity (low defect density), excellent uniformity and repeatability. FIG. 4 summarizes such potential processing operations that may be closely coupled with meniscus coating method of this invention to provide thin, uniform and defect-free coatings.

The cleaning processes may include solvent washing with brushes, ultrasonic scrubbing and/or other mechanical scrubbing methods. The substrate may then be rinsed with high purity water and/or solvent prior to solvent drying and removal. A porous cylindrical applicator may be utilized, also, to clean and rinse the substrate with solvents. Solvent drying may include evaporative operations via controlled gas flow and/or vacuum processes. Further solvent contaminants may be removed by oven heating and/or plasma treatments. The clean and dry substrates are then meniscus coated, according to the present method. Fluid film drying processes are similar to those employed in the solvent drying and removal operations. Several of the operations involved with the drying and coating processes may be purged with nitrogen and/or other inert gases to avoid oxygen and moisture contact.

The application of coatings by the present method is expected to be beneficial in many areas including microelectronic lithography, such as:
1. Photo resist applied to silicon wafers, whereby one micron lithography is used for manufacturing of memory circuits with increasing densities from 65K to 256K bits and micro-processor chips, going to 32 bits, etc.
2. Photo resist applied to round, square or rectangular silicon wafers for solar devices.
3. Photo resist applied to glass substrates such as plasma and liquid crystal display panels, thin film devices, masks, etc.
4. Photo resist applied to hydrid circuit material such as ceramic (alumina).

5. Coatings such as polyimide, non-reflective materials, current conductive films, dopants, etc. can be applied to silicon wafers, glass, metallized glass and ceramic surfaces, etc.

6. Other coatings such as cleaning fluid, rinsing material and gaseous drying medium may be applied to substrates, according to the present method.

We claim:

1. Method of meniscus coating of an object comprising:
   A. Flowing a coating material from the interior and through the wall of a stationary, permeable cylindrical surface, so as to develop downward laminar flow of coating material on the outside of the cylindrical surface;
   B. Advancing an object to be coated in a plane tangentially to said laminar flow of coating material, such that a leading surface portion of the object intersects laminar flow of coating material at the apex of the cylindrical surface;
   C. Supporting uniform meniscii of flowing coating material both at the leading edge and the trailing edge of coating material contacting said object; and
   D. Uniformly disengaging the coated surface of the object from said lamainar flow of coating material.

2. Method of meniscus coating of an object as in claim 1, wherein supporting of meniscii is affected by varying the rate of flowing of coating material and the speed of advancing of the object.

3. Method of meniscus coating of an object as in claim 2, wherein the surface of the object to be coated is inverted, such that the object itself shields the coating material during coating.

4. Method of meniscus coating of an object as in claim 3, wherein the speed of advancing said object to be coated is adjusted to allow cleansing of the substrate surface by the laminar flowing of filtered coating material through the permeable and sloping surfaces, while the downward laminar flow of coating material assists in the removal of excess coating material deposited upon the substrate surface.

5. Method of meniscus coating of an object as in claim 1, wherein said flowing of coating material is in random radial streams through the wall of said stationary cylinder.

6. Method of meniscus coating of an object as in claim 5, including masking the lower wall of the cylinder, so as to preclude flowing of coating material therethrough.

7. Method of meniscus coating of an object as in claim 5, including filtering of said coating material simultaneously with said flowing.

8. Method of meniscus coating of an object as in claim 5, including filtering of said coating material during flowing through said cylinder.

9. Method of meniscus coating of an object as in claim 1, further including initially scrubbing and rinsing said object prior to said flowing of coating material.

10. Method of meniscus coating of an object as in claim 9, further including plasma cleaning of the object surface prior to said flowing of coating material.

11. Method of meniscus coating of an object as in claim 10, including drying of the object surface, sequentially of coating.

12. Method of meniscus coating of an object as in claim 7, wherein said filtering of coating material is through a process filtering medium supported beneath said cylindrical surface.

13. Method of meniscus coating of an object as in claim 3, wherein said coating material is a cleaning fluid.

14. Method of meniscus coating of an object as in claim 3, wherein said coating material is a rinsing material.

15. Method of meniscus coating of an object as in claim 3, wherein said coating material is a gaseous drying medium, such that gaseous flowing through a permeable surface in close proximity to the object surface assists evaporation of moisture and solvents from said substrate surface.

* * * * *